United States Patent
Imafuku et al.

(10) Patent No.: US 8,443,253 B2
(45) Date of Patent: May 14, 2013

(54) TURBO DECODING DEVICE AND COMMUNICATION DEVICE

(75) Inventors: Kazuaki Imafuku, Fukuoka (JP); Kazuhisa Obuchi, Kawasaki (JP); Shunji Miyazaki, Kawasaki (JP); Hideaki Yamada, Fukuoka (JP); Mutsumi Saito, Fukuoka (JP); Masaru Inoue, Fukuoka (JP); Shingo Hotta, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 494 days.

(21) Appl. No.: 12/876,541

(22) Filed: Sep. 7, 2010

(65) Prior Publication Data

US 2011/0078542 A1 Mar. 31, 2011

(30) Foreign Application Priority Data

Sep. 30, 2009 (JP) ................................ 2009-228849

(51) Int. Cl.
*H03M 13/27* (2006.01)
*H03M 13/29* (2006.01)

(52) U.S. Cl.
USPC .......................................... 714/755; 714/774

(58) Field of Classification Search .................. 714/755, 714/774
See application file for complete search history.

(56) References Cited

U.S. PATENT DOCUMENTS

| | | | | |
|---|---|---|---|---|
| 8,032,801 B2 * | 10/2011 | Edmonston et al. | ........... | 714/701 |
| 8,051,239 B2 * | 11/2011 | Nieminen | ........................ | 711/5 |
| 8,065,588 B2 * | 11/2011 | Shen et al. | ..................... | 714/763 |
| 8,140,932 B2 * | 3/2012 | Blankenship | .................. | 714/755 |
| 8,201,030 B2 * | 6/2012 | Bae et al. | ....................... | 714/701 |
| 8,332,701 B2 * | 12/2012 | Lee et al. | ....................... | 714/743 |
| 2008/0092010 A1 | 4/2008 | Orio | | |
| 2008/0126914 A1 | 5/2008 | Ikeda | | |
| 2008/0205636 A1 | 8/2008 | Nimbalker et al. | | |

FOREIGN PATENT DOCUMENTS

| | | |
|---|---|---|
| EP | 1 850 486 | 10/2007 |
| JP | 2008-118628 | 5/2008 |
| JP | 2008-135813 | 6/2008 |
| JP | 2008-219892 | 9/2008 |
| WO | 2006/082923 | 8/2006 |

OTHER PUBLICATIONS

Extended European Search Report for corresponding EP patent application No. 10176753.1, dated Mar. 11, 2011.

(Continued)

*Primary Examiner* — Stephen M Baker
(74) *Attorney, Agent, or Firm* — Myers Wolin, LLC

(57) ABSTRACT

A turbo decoding device includes a memory unit that stores data in an interleaving process performed in a process of decoding a coded signal encoded with a turbo code and an access unit that accesses the memory unit to read and write the data. The memory unit includes memory circuits and is formed as one memory space by coupling the memory circuits. Furthermore, the memory circuit functions as a first bank configuration by which a first capacity is assigned to each bank or a second bank configuration by which a second capacity is assigned to each bank in accordance with a combination of the memory circuits. Moreover, the access unit selects by which of the first bank configuration and the second bank configuration the memory unit functions in accordance with a communication method of a coded signal and accesses the memory unit in accordance with the selected bank configuration.

5 Claims, 16 Drawing Sheets

OTHER PUBLICATIONS

In-Cheol Park et al., "Processor-Based Turbo Interleaver for Multiple Third-Generation Wireless Standards," IEEE Communications Letters, IEEE Service Center, Piscataway, NJ, US, vol. 7, No. 5, May 1, 2003, pp. 210-212.

Rizwan Asghar et al., "Dual Standard Re-configurable Hardware Interleaver for Turbo Decoding," Wireless Pervasive Computing, 2008, ISWPC 2008; 3rd International Symposium; IEEE, Piscataway, NJ, USA, May 7, 2008, pp. 768-772.

* cited by examiner

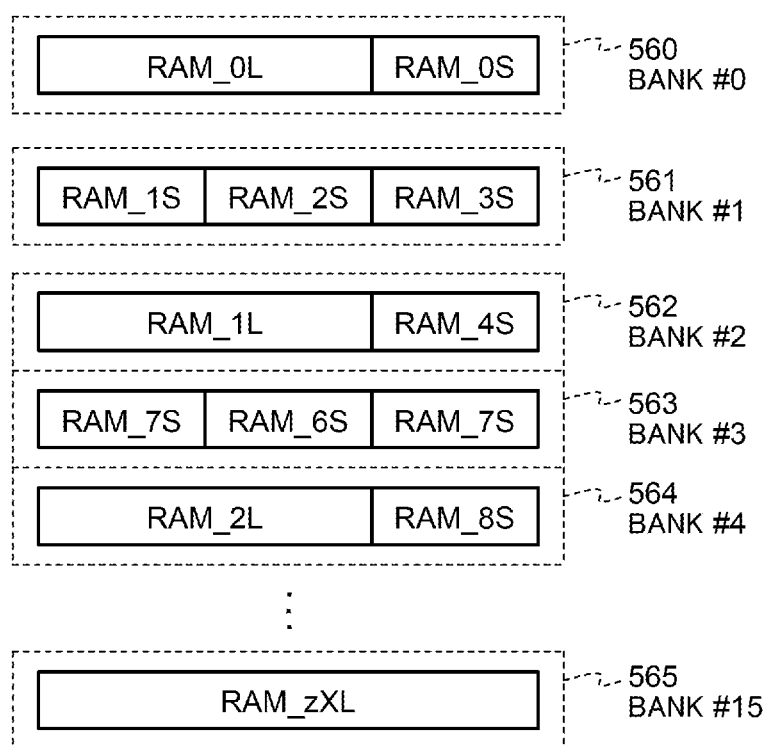

FIG.12A

| COMMUNICATION METHOD | BANK | ADROFS (PHYSICAL ADDRESS) |
|---|---|---|
| HSPA+ | BANK #0 | 0 |
| | BANK #1 | 256 |
| | BANK #2 | 512 |
| | BANK #3 | 768 |
| | ⋮ | ⋮ |
| | BANK #19 | 4864 |

FIG.12B

| COMMUNICATION METHOD | BANK | ADROFS (PHYSICAL ADDRESS) |
|---|---|---|
| LTE | BANK #0 | 0 |
| | BANK #1 | 384 |
| | BANK #2 | 768 |
| | BANK #3 | 1152 |
| | BANK #4 | 1536 |
| | ⋮ | ⋮ |
| | BANK #15 | 5760 |

FIG.13A

| BANK | ADRMINI<br>(LOGICAL ADDRESS) | ADRMAX<br>(LOGICAL ADDRESS) |
|---|---|---|
| BANK #0 | 0 | 159 |
| BANK #1 | 160 | 319 |
| BANK #2 | 320 | 479 |
| BANK #3 | 480 | 639 |
| BANK #4 | 640 | 799 |
| ⋮ | ⋮ | ⋮ |
| BANK #19 | 3040 | 3199 |

FIG.13B

| BANK | ADRMINI<br>(LOGICAL ADDRESS) | ADRMAX<br>(LOGICAL ADDRESS) |
|---|---|---|
| BANK #0 | 0 | 199 |
| BANK #1 | 200 | 399 |
| BANK #2 | 400 | 599 |
| BANK #3 | 600 | 799 |
| BANK #4 | 800 | 999 |
| ⋮ | ⋮ | ⋮ |
| BANK #15 | 3000 | 3199 |

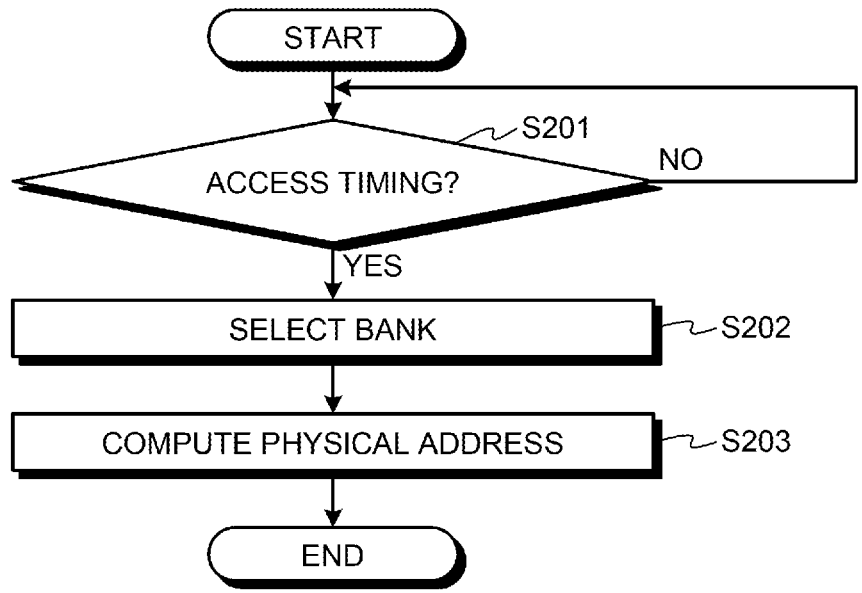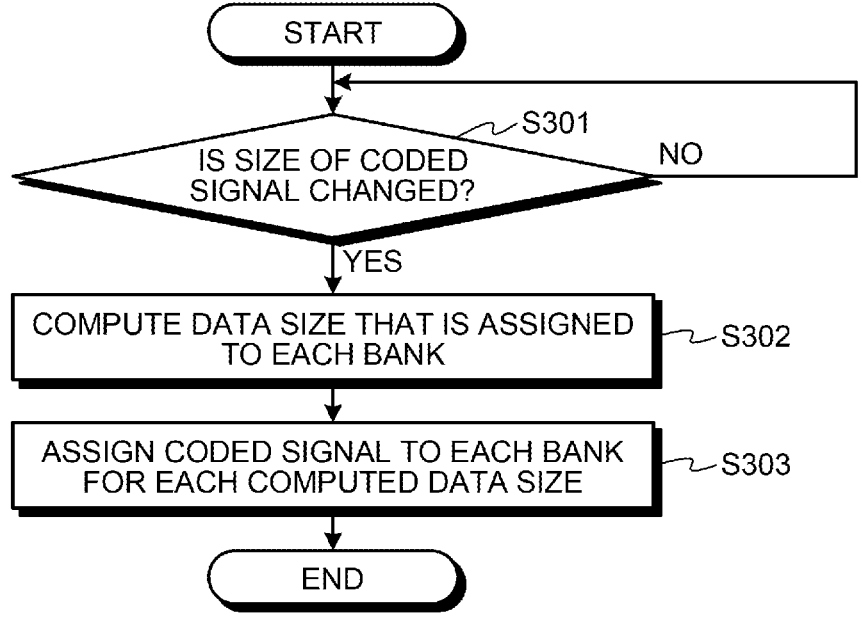

TURBO DECODING DEVICE AND COMMUNICATION DEVICE

CROSS-REFERENCE TO RELATED APPLICATION

This application is based upon and claims the benefit of priority of the prior Japanese Patent Application No. 2009-228849, filed on Sep. 30, 2009, the entire contents of which are incorporated herein by reference.

FIELD

The embodiments discussed herein are directed to a turbo decoding device and a communication device.

BACKGROUND

Conventionally, there are various methods as a communication method that is used for the data transmission and reception of a communication device such as a mobile terminal or a base station. For example, a communication method includes LTE (Long Term Evolution), HSPA+ (High Speed Packet Access+), and the like. Moreover, a communication device that uses LTE and HSPA+ uses a turbo code as an error correction code.

A communication device that uses a turbo code executes an interleaving process and a de-interleaving process in the process of decoding a signal encoded with the turbo code. In this case, an interleaving process is a process for rearranging the order of signals that are stored in a memory. Moreover, a de-interleaving process is a process for restoring the order of signals that are rearranged by the interleaving process.

It is further explained about an example of a turbo decoding process for decoding a signal encoded with a turbo code. For example, a communication device executes, when receiving a signal (A), a decoding process on the received signal (A) and stores its result in a memory. Then, the communication device executes an interleaving process on the signal (A), executes a decoding process on a signal (b) after the interleaving process, and again stores its result in the memory. Then, the communication device executes a de-interleaving process on the signal (B), executes a decoding process on a signal (C) after the de-interleaving process, and stores its result in the memory once more. In this case, the order of the signal (A) and signal (C) is the same.

In this case, the processing methods of an interleaving process and a de-interleaving process are different depending on the coding methods of a turbo code. Moreover, the coding methods of a turbo code are different depending on communication methods. For this reason, for example, LTE and HSPA+ execute different interleaving process and de-interleaving process. For example, a communication device that uses LTE uses "QPP (Quadratic Permutation Polynomial Interleaver)". On the other hand, a communication device that uses HSPA+ uses "PIL (Prunable Prime Interleaver)".

When executing a turbo decoding process, there is a communication device that executes a decoding process in parallel by performing reading and writing on a plurality of memories in parallel. For example, the communication device divides a signal into a plurality of signals and concurrently executes a decoding process on the divided signals. In this case, the capacity of each memory and the number of memories mounted on the communication device that concurrently executes the decoding process are different depending on the maximum size of a signal, the processing methods of an interleaving process and a de-interleaving process, the number of processes that are concurrently executed by the communication device, and the like.

For example, because the maximum sizes of a signal in LTE and HSPA+ are different, memories mounted on a communication device that uses LTE and memories mounted on a communication device that uses HSPA+ are different from each other in terms of the capacity of each memory and the number of memories. The technique has been known as disclosed in, for example, Japanese Laid-open Patent Publication Nos. 2008-135813, 2008-219892 and 2008-118628 and International Publication No. WO 2006/082923.

It is desired that a communication device that concurrently executes a decoding process corresponds to a plurality of communication methods. Moreover, it is demanded that the communication device corresponds to turbo decoding processes that are used for the communication methods after corresponding to the plurality of communication methods. Considering that the capacity and number of memories mounted on the communication device that concurrently executes the decoding process are different depending on communication methods, it is required a mounting device that mounts thereon separate memories depending on communication methods.

For example, when a communication device corresponding to both of LTE and HSPA+ is realized, a mounting device separately mounts memories that are used for executing a turbo decoding process by using LTE and memories that are used for executing a turbo decoding process by using HSPA+.

However, there is a problem in that the mounting device separately mounts memories depending on communication methods and thus the burden of memory increases.

SUMMARY

According to an aspect of an embodiment of the invention, a turbo decoding device includes a memory unit that stores data in an interleaving process performed in a process of decoding a coded signal encoded with a turbo code; and an access unit that accesses the memory unit to read and write the data. The memory unit includes a plurality of memory circuits, is formed as one memory space by coupling the plurality of memory circuits, and functions as a first bank configuration by which a first capacity is assigned to each bank or a second bank configuration by which a second capacity is assigned to each bank in accordance with a combination of the memory circuits. The access unit selects by which of the first bank configuration and the second bank configuration the memory unit functions in accordance with a communication method of the coded signal and accesses the memory unit in accordance with the selected bank configuration.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 8B is a diagram explaining an example of a bank configuration of using the plurality of memory circuits when LTE is used;

FIG. 12A is a diagram explaining an example of a bank configuration that is associated with HSPA+;

FIG. 12B is a diagram explaining an example of a bank configuration that is associated with LTE;

FIG. 13A is a diagram explaining an example of ADRMINI and ADRMAX that are set in each bank that uses HSPA+;

FIG. 13B is a diagram explaining an example of ADRMINI and ADRMAX that are set in each bank that uses LTE;

FIG. 16 is a flowchart explaining a flow example of a process that is performed by the converting unit according to the second embodiment; FIG. 17 is a flowchart explaining a flow example of a coded signal assignment process according to the second embodiment.

DESCRIPTION OF EMBODIMENTS

Preferred embodiments of the present invention will be explained with reference to accompanying drawings. The present invention is not limited to the embodiments explained below. The embodiments can be appropriately combined within a scope in which processing matters do not contradict each other.

[a] First Embodiment

Figure 1:
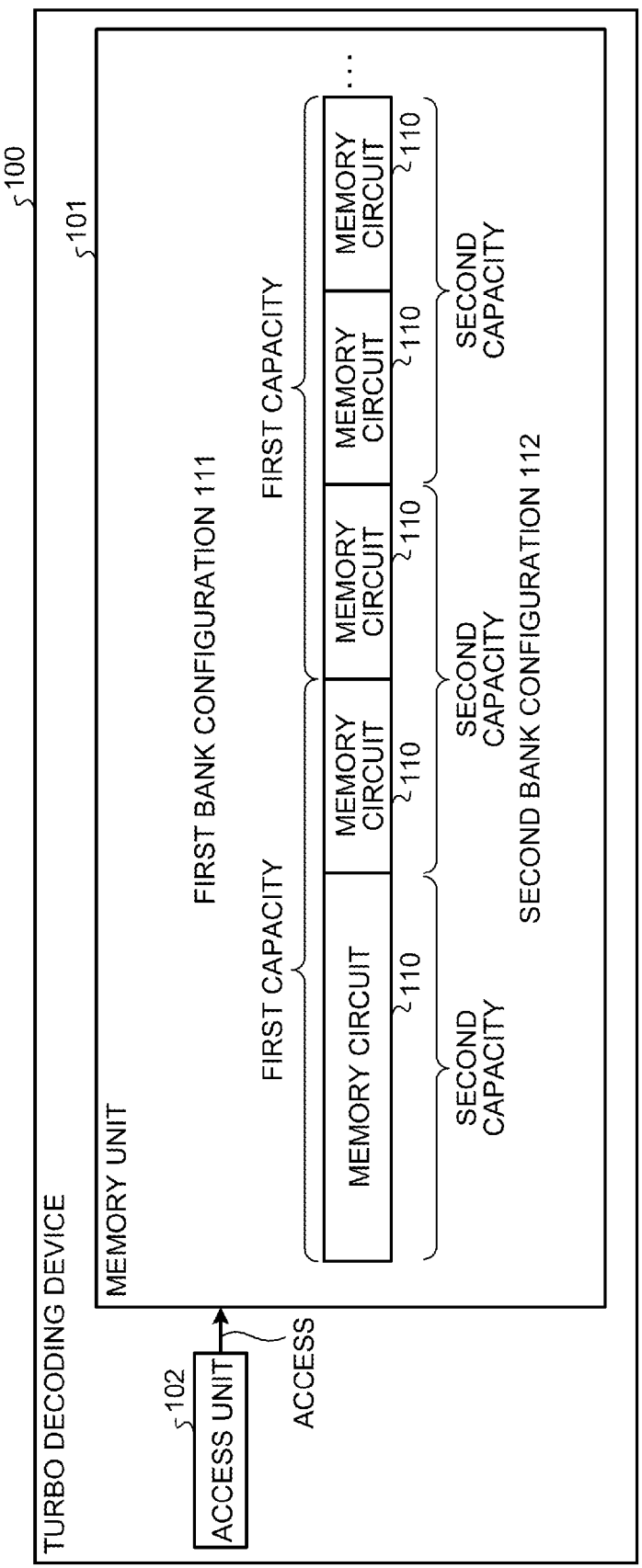
FIG. 1 is a block diagram explaining an example of the configuration of a turbo decoding device according to a first embodiment.

It will be explained about an example of the configuration of a turbo decoding device 100 according to the first embodiment with reference to FIG. 1. FIG. 1 is a block diagram explaining an example of the configuration of the turbo decoding device 100 according to the first embodiment. In an example illustrated in FIG. 1, the turbo decoding device 100 includes a memory unit 101 and an access unit 102.

In the case of an interleaving process performed in the process of decoding a coded signal encoded with a turbo code, the memory unit 101 stores data. Moreover, the memory unit 101 includes a plurality of memory circuits 110 and is formed as one memory space by coupling the plurality of memory circuits 110. Furthermore, the memory unit 101 functions as a first bank configuration 111 by which a first capacity is assigned to each bank or a second bank configuration 112 by which a second capacity is assigned to each bank in accordance with the combination of the memory circuits 110.

The access unit 102 accesses the memory unit 101 to read or write data. Moreover, the access unit 102 selects which of the first bank configuration 111 and the second bank configuration 112 functions as the memory unit 101 in accordance with the communication method of a coded signal, and accesses the memory unit 101 in accordance with the selected bank configuration.

In other words, considering that the capacity and number of memories mounted on a communication device that concurrently executes a decoding process are different depending on communication methods, the turbo decoding device 100 includes the plurality of subdivided memory circuits 110. The turbo decoding device 100 changes the combination of the memory circuits 110 in accordance with a communication method to change the capacity of each bank and the number of banks. As a result, according to the first embodiment, the burden of memory can be suppressed without preparing a memory depending on a communication method.

[b] Second Embodiment

Next, it will be explained about a turbo decoding device 200 according to the second embodiment. Hereinafter, after the whole picture of the turbo decoding device 200 is simply explained, it will be sequentially explained about the configuration, process, and effect of the turbo decoding device 200.

Whole Picture of Turbo Decoding Device

Figure 2:
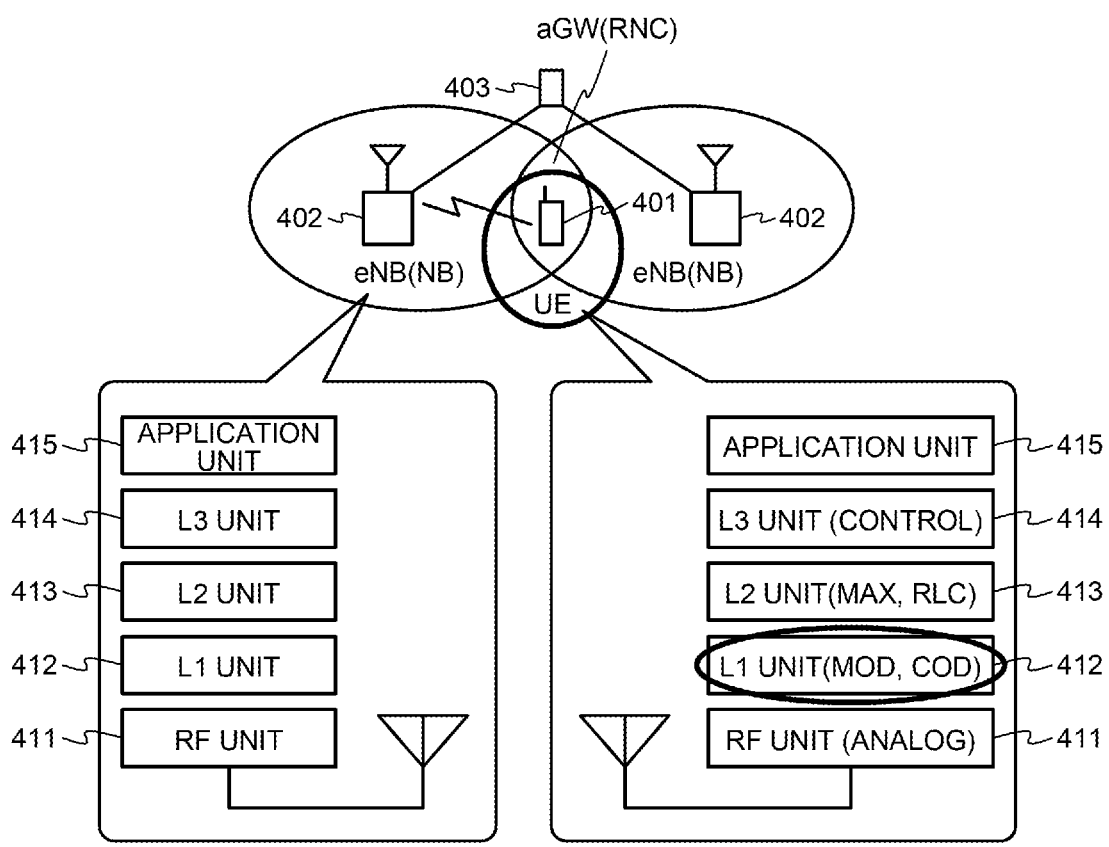
FIG. 2 is a diagram simply explaining an example of a turbo decoding device according to a second embodiment.

The whole picture of the turbo decoding device is simply explained. First, it will be simply explained about an example of the turbo decoding device 200 according to the second embodiment with reference to FIG. 2. FIG. 2 is a diagram simply explaining an example of the turbo decoding device 200 according to the second embodiment.

It will be simply explained about FIG. 2. A UE (User Equipment) 401 illustrated in FIG. 2 is a mobile terminal. An eNB (evolutional Node B) 402 illustrated in FIG. 2 is a base station. An aGW (RNC) (Access Gate way (Radio Network Controller)) 403 illustrated in FIG. 2 is a gateway device. In FIG. 2, the UE 401 and the eNB 402 transmit and receive a coded signal via wireless communication. Moreover, the aGW (RNC) 403 relays the transmission and reception of data between the eNBs 402. In this case, each of the UE 401 and the eNB 402 includes an RF unit 411 that transmits and receives a coded signal and an L1 unit 412 that performs a turbo decoding process that is a process for decoding a coded signal. Furthermore, each of the UE 401 and the eNB 402 includes an L2 unit 413 that executes a process in an L2 layer, an L3 unit 414 that executes a process in an L3 layer, and an application unit 415 that executes various types of applications.

The turbo decoding device 200 performs a turbo decoding process. In other words, in an example illustrated in FIG. 2, the UE 401 and the eNB 402 correspond to the turbo decoding device 200. More specifically, the turbo decoding device 200 is applied to the L1 unit 412 included in the UE 401 and the eNB 402. In an example illustrated in FIG. 2, it has been explained about the case where the turbo decoding device 200 corresponds to the UE 401 and the eNB 402. However, the present invention is not limited to this. For example, when the aGW (RNC) 403 executes a turbo decoding process, the aGW (RNC) 403 also corresponds to the turbo decoding device 200. Moreover, the turbo decoding device 200 may be any device if it is a device that performs a turbo decoding process.

It will be simply explained about a turbo decoding process that is executed by the turbo decoding device 200. When receiving a coded signal (A), the turbo decoding device 200 executes a decoding process on the received coded signal (A) and stores the result in a memory. Then, the turbo decoding device 200 executes an interleaving process on the coded signal (A), executes the decoding process on a signal (B) after the interleaving process, and again stores the result in the memory. Then, the turbo decoding device 200 executes a de-interleaving process on the signal (B), executes the decoding process on a signal (C) after the de-interleaving process, and stores the result in the memory once more.

Moreover, the turbo decoding device 200 corresponds to a plurality of communication methods. For example, the turbo decoding device 200 corresponds to LTE (Long Term Evolution) and HSPA+ (High Speed Packet Access+) as a communication method. Moreover, when executing a turbo decoding process, the turbo decoding device 200 performs the reading and writing on the plurality of memories in parallel to execute the decoding process in parallel. Specifically, the turbo decoding device 200 divides a coded signal into a plurality of signals and concurrently executes the decoding process on the divided signals. Hereinafter, unless it is mentioned particularly, it is explained about the case where the turbo decoding device 200 concurrently executes 16 decoding processes. However, the present invention is not limited to this. For example, the turbo decoding device 200 may concurrently execute 15 or less decoding processes, may concurrently execute 17 or more decoding processes, or may concurrently execute decoding processes of which the number is not defined.

Moreover, as described in detail in the explanation about the configuration of the turbo decoding device 200, the turbo decoding device 200 includes the plurality of memories and changes the combination of memories in accordance with a communication method to change the capacity of each memory bank and the number of memory banks. As a result, the turbo decoding device 200 can execute interleaving and de-interleaving processes that have a different method by using the same memory.

Configuration of Turbo Decoding Device

Figure 3:
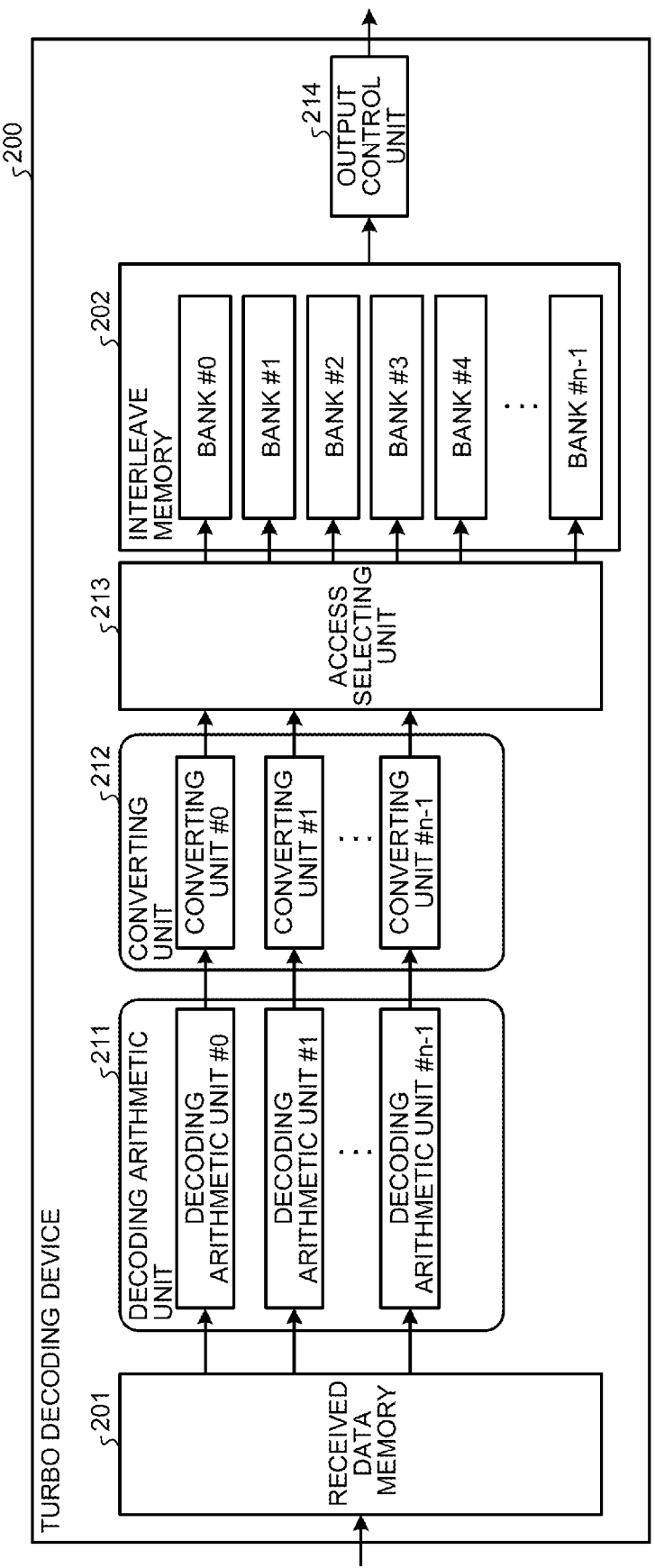
FIG. 3 is a block diagram explaining an example of the configuration of the turbo decoding device according to the second embodiment.

It will be explained about an example of the configuration of the turbo decoding device 200 according to the second embodiment with reference to FIG. 3. FIG. 3 is a block diagram explaining an example of the configuration of the turbo decoding device according to the second embodiment. In an example illustrated in FIG. 3, the turbo decoding device 200 includes a received data memory 201, an interleave memory 202, a decoding arithmetic unit 211, a converting unit 212, an access selecting unit 213, and an output control unit 214.

Hereinafter, it will be explained about the case where the turbo decoding device 200 corresponds to LTE and HSPA+ as an example. However, the present invention is not limited to this. For example, the turbo decoding device 200 may correspond to another communication method in addition to LTE and HSPA+. For example, the turbo decoding device 200 may correspond to one of LTE and HSPA+ and a communication method other than LTE and HSPA+. Moreover, the turbo decoding device 200 may correspond to a plurality of communication methods other than LTE and HSPA+ without corresponding to LTE and HSPA+.

Returning to the explanation of FIG. 3, the received data memory 201 is connected to the decoding arithmetic unit 211. The received data memory 201 is, for example, a semiconductor memory device such as RAM (Random Access Memory) or a flash memory. The received data memory 201 stores thereon a coded signal that is received by the turbo decoding device 200. Moreover, the coded signal stored in the received data memory 201 is acquired by the decoding arithmetic unit 211.

Figure 4:
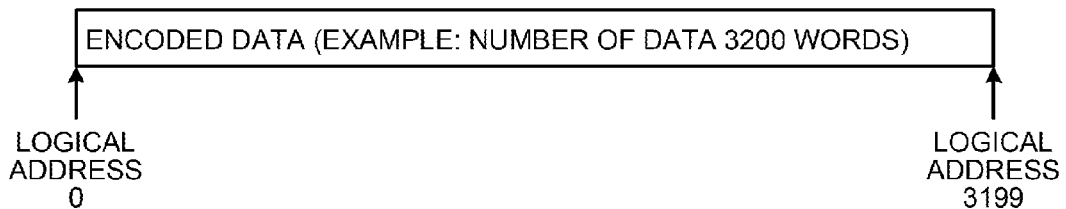
FIG. 4 is a diagram explaining an example of a coded signal that is stored in a received data memory.

It will be explained about an example of a coded signal that is stored in the received data memory 201 with reference to FIG. 4. FIG. 4 is a diagram explaining an example of a coded signal that is stored in the received data memory. In an example illustrated in FIG. 4, there is illustrated the case where the data size of a coded signal is "3200 words". In this case, a word is a unit that indicates the size of data. Hereinafter, information of uniquely identifying data that form a coded signal is referred to as a "logical address". In other words, in an example illustrated in FIG. 4, the logical addresses of data that form a 3200-word coded signal are "0" to "3199". A logical address is further referred to as "first identification information".

Hereinafter, unless it is mentioned particularly, as illustrated in FIG. 4, it is explained about the case where the turbo decoding device 200 receives a 3200-word coded signal. In other words, it is explained about the case where the received data memory 201 stores a 3200-word coded signal. Hereinafter, it is further explained about the case where the turbo decoding device 200 receives a 3200-word coded signal. However, the present invention is not limited to this. For example, the turbo decoding device 200 may receive a coded signal that has the size larger than 3200 words, or may receive a coded signal that has the size smaller than 3200 words.

The size of a coded signal received by the turbo decoding device 200 is different depending on data that are transmitted and received. Moreover, the maximum size of a coded signal is decided by a communication method. For example, when performing the transmission and reception of data by using LTE, the maximum size of a coded signal is "6140 words". The turbo decoding device 200 receives a coded signal of "0 to 6140 words". Moreover, for example, when performing the transmission and reception of data by using HSPA+, the maximum size of a coded signal is "5120 words". In this case, the turbo decoding device 200 receives a coded signal of "0 to 5120 words".

Returning to the explanation of FIG. 3, the interleave memory 202 is connected to the access selecting unit 213 and the output control unit 214. The interleave memory 202 is, for example, a semiconductor memory device such as RAM or a flash memory.

The interleave memory 202 stores data in the case of an interleaving process performed in the process of decoding a coded signal. Specifically, the interleave memory 202 includes a plurality of memory circuits and is formed as one memory space by coupling the plurality of memory circuits.

Figure 5:
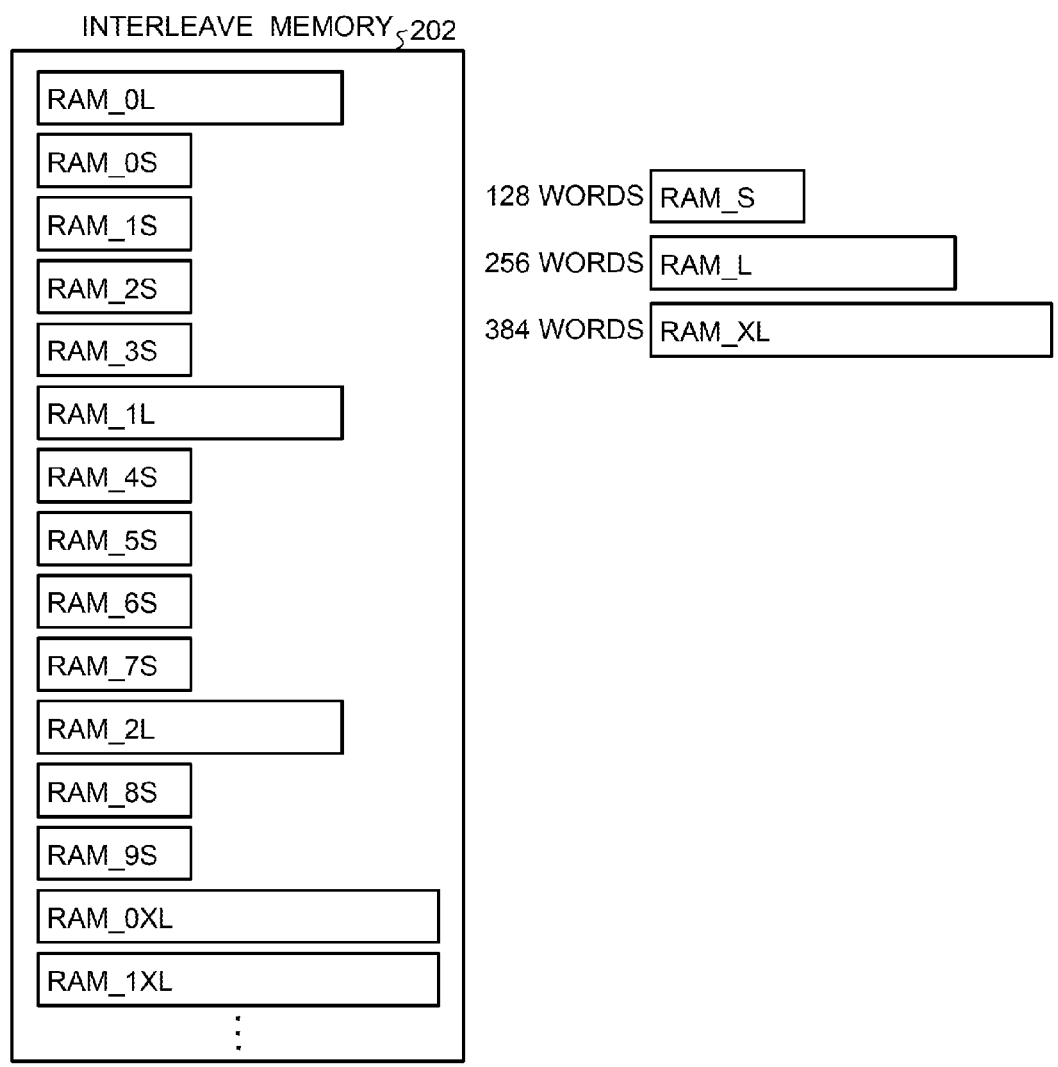
FIG. 5 is a diagram explaining the case where a interleave memory includes a plurality of memory circuits.

It will be explained about the case where the interleave memory 202 includes the plurality of memory circuits with reference to FIG. 5. FIG. 5 is a diagram explaining the case where the interleave memory includes the plurality of memory circuits. Each of the RAMs of FIG. 5 indicates a memory circuit. Hereinafter, it is considered that "RAM_nS" (n is a natural number) has the capacity of 128 words, "RAM_nL" (n is a natural number) has the capacity of 256 words, and "RAM_nXL" (n is a natural number) has the capacity of 384 words. In addition, when "n" is the same number among memory circuits having the same capacity, it is assumed that memory circuits having the same number are the same memory circuit.

In an example illustrated in FIG. 5, the interleave memory 202 includes plural kinds of memory circuits that have different capacities. For example, the interleave memory 202 includes "RAM_0S" to "RAM_9S", "RAM_0L" to "RAM_2L", and "RAM_0XL" to "RAM_1XL". In an example illustrated in FIG. 5, it has been explained about the case where the interleave memory 202 includes plural kinds of memory circuits that have different capacities. However, the present invention is not limited to this. For example, the interleave memory 202 may selectively include memory circuits that have the same capacity.

Figure 6A:
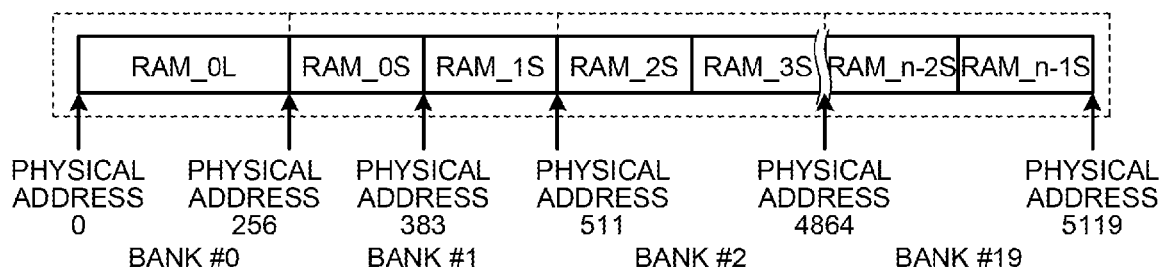
FIG. 6A is a diagram explaining a memory space formed when HSPA+ is used as a communication method.
Figure 6B:
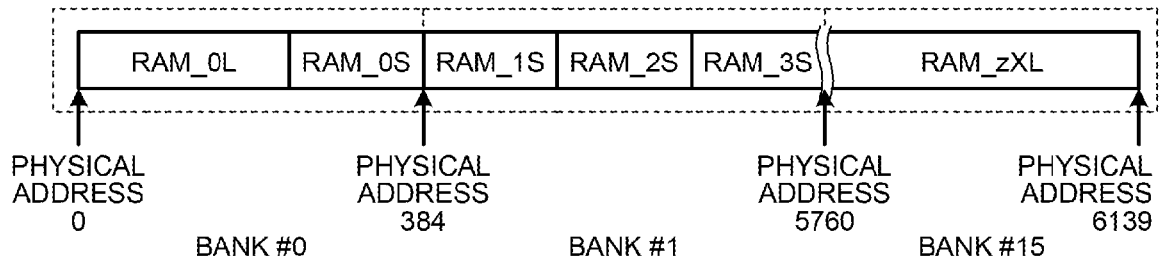
FIG. 6B is a diagram explaining a memory space formed when LTE is used as a communication method.

It will be explained about the case where one memory space is formed by coupling a plurality of memory circuits with reference to FIGS. 6A and 6B. FIG. 6A is a diagram explaining a memory space formed when HSPA+ is used as a communication method. FIG. 6B is a diagram explaining a memory space formed when LTE is used as a communication method. Each of the RAMs of FIGS. 6A and 6B means the memory circuit of the interleave memory 202. Hereinafter, information of uniquely identifying the position of the memory space formed on the interleave memory 202 is referred to as a "physical address". Moreover, it is explained about the case where one physical address corresponds to one-word data. A physical address is further referred to as "second identification information".

When HSPA+ is used, considering that the maximum size of a coded signal is "5120 words", a memory space having the capacity of "5120 words" is formed on the interleave memory 202 as illustrated in FIG. 6A. In other words, as described below, the converting unit 212 provides physical addresses from "0" to "5119" to the memory circuits so as to form a memory space having the capacity of "5120 words" on the interleave memory 202. For example, in an example illustrated in FIG. 6A, physical addresses "0" to "255" are given to "RAM_0L" and physical addresses "256" to "383" are given to "RAM_0S".

When LTE is used, considering that the maximum size of a coded signal is "6140 words", a memory space having the capacity of "6140 words" is formed on the interleave memory 202 as illustrated in FIG. 6B.

Moreover, a memory space formed on the interleave memory 202 is formed by using a plurality of banks. The banks are realized by using separate memory circuits. For example, in FIG. 6A, the memory space formed on the interleave memory 202 is realized by using banks "bank #0" to "bank #19". Moreover, in an example illustrated in FIG. 6A, "bank #0" is realized by using RAM0L and "bank #1" is realized by using RAM0S and RAM1S. Moreover, in FIG. 6B, the case where a memory space is formed is illustrated by using "bank #0" to "bank #15".

In this case, the banks are formed by using separate memory circuits and the turbo decoding device 200 accesses the banks in parallel to read and write data. In FIGS. 6A and 6B, it has been illustrated about the case where the number of banks is 20 and 16. However, the present invention is not limited to this. It may be an arbitrary number.

Moreover, the interleave memory 202 functions as the first bank configuration by which the first capacity is assigned to each bank or functions as the second bank configuration by which the second capacity is assigned to each bank, in accordance with the combination of the memory circuits.

Figure 7A:
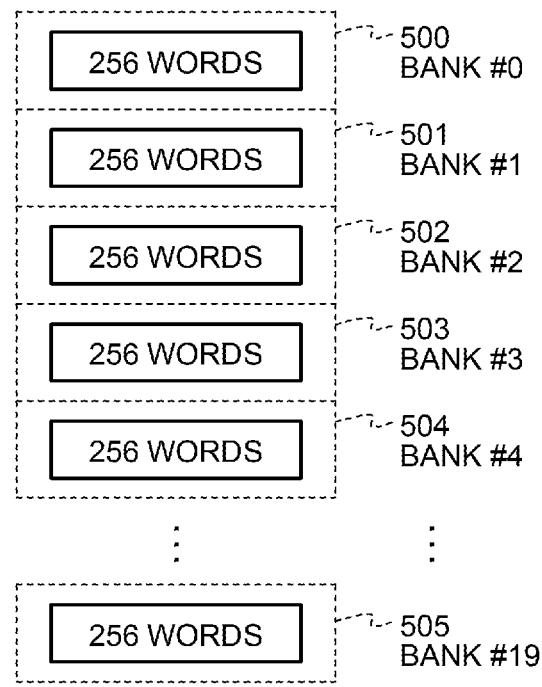
FIG. 7A is a diagram explaining an example of a bank configuration when HSPA+ is used.
Figure 7B:
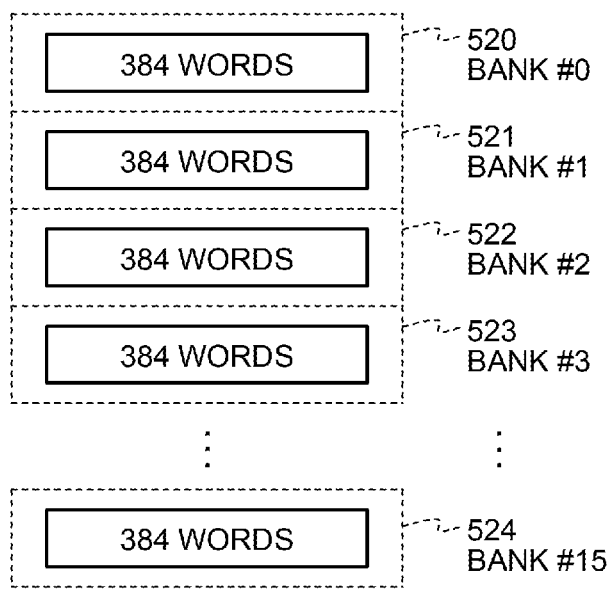
FIG. 7B is a diagram explaining an example of a bank configuration when LTE is used.

It will be explained about an example of a bank configuration corresponding to each communication method with reference to FIGS. 7A and 7B. FIG. 7A is a diagram explaining an example of a bank configuration when HSPA+ is used. FIG. 7B is a diagram explaining an example of a bank configuration when LTE is used. The reference numbers 500 to 505 of FIG. 7A and the reference numbers 520 to 524 of FIG. 7B indicate banks. Moreover, the capacity of each bank is represented for the corresponding bank.

It will be explained about the case where HSPA+ is used. In FIG. 7A, as an example, 20 banks are formed on the interleave memory 202 and the capacity of 256 words is assigned to each bank. When HSPA+ is used, a number such as "5", "10", or "20" is used as the number of banks in many cases. In this case, considering that the turbo decoding device 200 concurrently executes 16 decoding processes as described above in the second embodiment, it is illustrated about the case where 20 banks larger than "16" are used in an example of FIG. 7A. Moreover, the capacity that is assigned to each bank is a value that is obtained by dividing the maximum size of data, which is transmitted and received in a communication method, by the number of banks. For example, when the number of banks is "20" and the maximum size is "5120 words", the value becomes "5120/20=256".

Moreover, it will be explained about the case where LTE is used. In FIG. 7B, 16 banks are formed on the interleave memory 202 and the capacity of 384 words is assigned to each bank as an example. In the case of LTE, considering that a number such as "5", "10", or "20" is not used in many cases as the number of banks, "16" by which the turbo decoding device 200 concurrently executes decoding processes is used as the number of banks in an example illustrated in FIG. 7B. In FIGS. 7A and 7B, it is illustrated about the cases where the number of banks is 20 and 16. However, the present invention is not limited to this. It may be an arbitrary number.

Figure 8A:
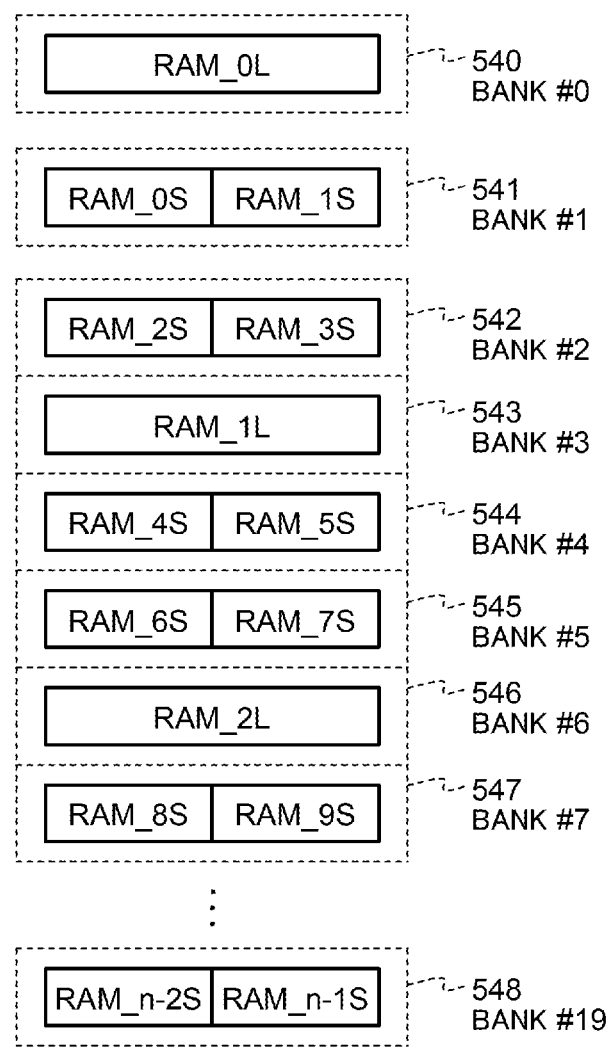
FIG. 8A is a diagram explaining an example of a bank configuration of using the plurality of memory circuits when HSPA+ is used.

It will be explained about an example of a bank configuration of using a plurality of memory circuits with reference to FIGS. 8A and 8B. FIG. 8A is a diagram explaining an example of a bank configuration of using a plurality of memory circuits when HSPA+ is used. FIG. 8A corresponds to FIG. 7A. FIG. 8B is a diagram explaining an example of a bank configuration of using the plurality of memory circuits when LTE is used. FIG. 8B corresponds to FIG. 7B. The reference numbers 540 to 548 of FIG. 8A and the reference numbers 560 to 565 of FIG. 8B indicate banks. Moreover, "RAM_nS", "RAM_nL", and "RAM_nXL" (n is a natural number) of FIG. 8A and FIG. 8B respectively indicate the memory circuits included in the interleave memory 202.

It will be explained about the case where HSPA+ is used. In other words, it will be explained about the case where the bank configuration illustrated in FIG. 7A is realized by using a plurality of memory circuits. In this case, as illustrated in FIG. 8A, each bank is, for example, realized by using two "RAM_nS" of which each has the capacity of 128 words. Alternatively, each bank is realized by using one "RAM_nL" that has the capacity of 256 words.

It will be explained about the case where LTE is used. In other words, it will be explained about the case where the bank configuration illustrated in FIG. 7B is realized by using a plurality of memory circuits. In this case, as illustrated in FIG. 8B, each bank is, for example, realized by using three "RAM_nS" of which each has the capacity of 128 words. Moreover, each bank is, for example, realized by using one "RAM_nL" that has the capacity of 256 words and one "RAM_nS". Moreover, each bank is realized by using one "RAM_zXL" that has the capacity of 384 words.

As illustrated in FIGS. 8A and 8B, even if HSPA+ is used or even if LTE is used, the interleave memory 202 uses the same memory circuit. For example, RAM_0L used in "bank #0" of FIG. 8A and RAM_0L used in "bank #0" of FIG. 8B are the same memory circuit.

Now, it will be explained about a physical address that is given to each memory circuit. As described above, one memory space is formed on the interleave memory 202 by coupling the plurality of memory circuits, and a series of physical addresses is previously given to them. Specifically, after considering the bank configuration used by the turbo decoding device 200, a series of physical addresses is previously given to the memory circuits. More specifically, after considering the capacity of each bank in the bank configuration, a series of physical addresses is given. In this case, the physical address given to each memory circuit is the same regardless of the bank configuration. In addition, the memory circuits are previously provided with a series of physical addresses.

Now, it is explained about the case where a bank configuration in which the capacity of each bank is "256 words" and a bank configuration in which the capacity of each bank is "384 words" are used. In this case, considering that the banks are realized with different memory circuits, a series of physical addresses is given to the memory circuits in such a manner that different memory circuits are used every "256 words" and different memory circuits are used every "384 words". For example, a series of physical addresses is given to the memory circuits in such a manner that memory circuits are changed in the stage of 256 words, 384 words, 512 words (256×2), 768 words (256×3 or 384×2), and the like.

In the case of the explanation using an example illustrated in FIG. 5, in the interleave memory 202, a series of physical addresses is sequentially given from the upper memory circuit to the lower memory circuit among the memory circuits illustrated in FIG. 5. More specifically, in the interleave memory 202, physical addresses "0 to 255" are given to RAM_0L and physical addresses "256 to 383" are given to RAM_0S. Similarly, a series of physical addresses is given to memory circuits in order of RAM_1S, RAM_2S, RAM_3S, RAM_1L, RAM_4S, RAM_5S, RAM_6S, RAM_7S, RAM_2L, RAM_8S, and RAM_9S.

In other words, in an example illustrated in FIG. 5, the memory circuits to which a series of physical addresses is given are changed from RAM_0L to RAM_0S in the stage of 256 words and are changed from RAM_0S to RAM 1S in the stage of 384 words. In this way, after considering the capacity of each bank, a series of physical addresses that is used irrespective of a bank configuration is given to memory circuits. As a result, as described in detail when being explained about the converting unit 212, the process when accessing the interleave memory 202 can be executed in the same way even if a bank configuration is changed.

Returning to the explanation of FIG. 3, the decoding arithmetic unit 211 is connected to the received data memory 201 and the converting unit 212. The decoding arithmetic unit 211 is, for example, an electronic circuit such as ASIC (Application Specific Integrated Circuit), FPGA (Field Programmable Gate Array), CPU (Central Processing Unit), or MPU (Micro Processing Unit).

The decoding arithmetic unit 211 includes a plurality of processing units. In an example illustrated in FIG. 3, the decoding arithmetic unit 211 includes a decoding arithmetic component #0 to a decoding arithmetic component #n-1. Hereinafter, unless it is mentioned particularly, it is explained about the case where the decoding arithmetic unit 211 includes 16 decoding arithmetic components. In other words, the decoding arithmetic unit 211 executes 16 decoding processes in parallel by concurrently executing processes by the 16 decoding arithmetic components. Hereinafter, it is explained about the case where the decoding arithmetic unit 211 includes 16 decoding arithmetic components. However, the present invention is not limited to this. The decoding arithmetic unit 211 may use decoding arithmetic components of which the number is arbitrary.

When a coded signal is stored in the received data memory 201, the decoding arithmetic unit 211 reads out the coded signal and executes a turbo decoding process on the read coded signal. Specifically, the decoding arithmetic unit 211 executes a turbo decoding process with the cooperation between the decoding arithmetic components. Then, the decoding arithmetic unit 211 stores the coded signal decoded by the turbo decoding process in the interleave memory 202.

Figure 9:
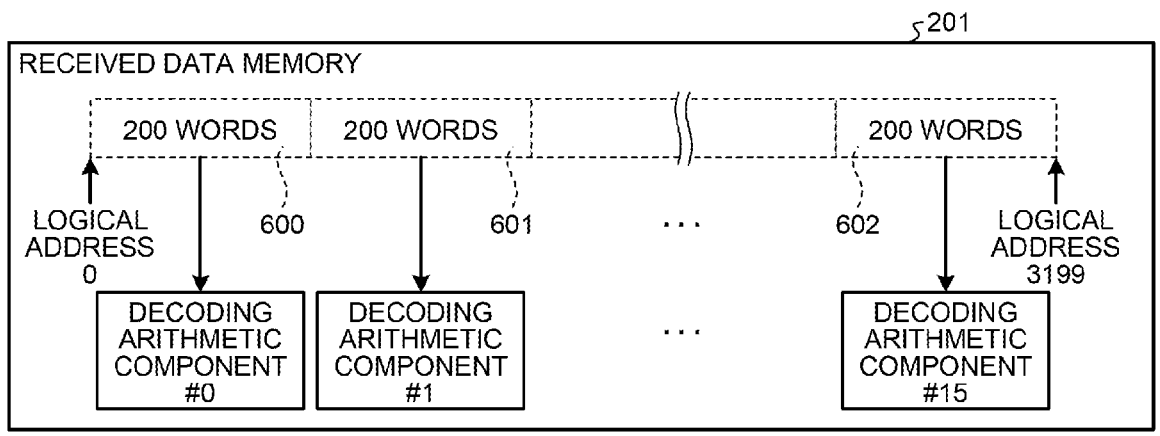
FIG. 9 is a diagram explaining a turbo decoding process that is executed with the cooperation of each decoding arithmetic component.
Figure 10:
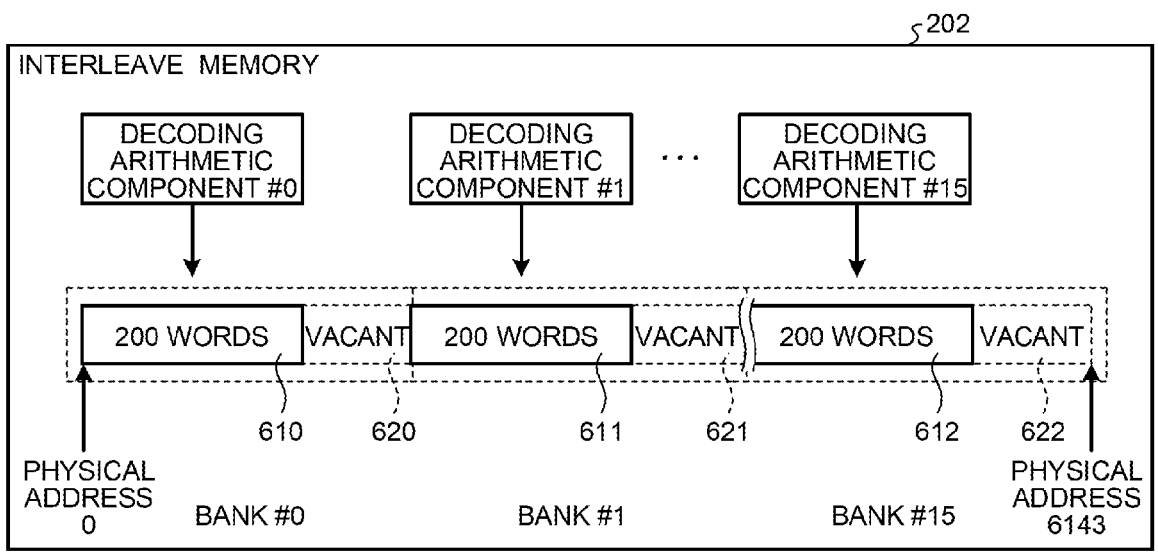
FIG. 10 is a diagram explaining the turbo decoding process that is executed with the cooperation of each decoding arithmetic component.

It is further explained about a turbo decoding process that is executed with the cooperation between the decoding arithmetic components. FIGS. 9 and 10 are diagrams explaining a turbo decoding process that is executed with the cooperation between the decoding arithmetic components. In FIG. 9, the received data memory 201, the coded signal stored in the received data memory 201, and the decoding arithmetic components are illustrated. Moreover, the reference numbers 600 to 602 of FIG. 9 indicate parts that are obtained by dividing the coded signal by the number of the decoding arithmetic components. In other words, when the data capacity of the coded signal is 3200 words and the number of the decoding arithmetic components is 16, the size of each part is "200". In FIG. 10, the decoding arithmetic components and the interleave memory 202 are illustrated. Moreover, banks are clearly illustrated in the interleave memory 202. In an example illustrated in FIG. 10, it is explained about the case where the number of banks is 16 and the capacity of each bank is 384 words as illustrated in FIGS. 7B and 8B. Moreover, the reference numbers 610 to 612 of FIG. 10 indicate parts that store data in the banks and the reference numbers 620 to 622 of FIG. 10 indicate vacant parts that do not store data in the banks.

In this case, as illustrated in FIG. 9, each of the decoding arithmetic components reads ¹⁄₁₆ of a coded signal (1) from the received data memory 201, and the components concurrently execute a decoding process. In other words, each of the decoding arithmetic components reads out a part of the coded signal (1) that corresponds to the component itself and executes the decoding process on the read part. For example, the decoding arithmetic component #0 reads out the part 600 corresponding to one of parts that are obtained by dividing the coded signal (1) by 16 and executes the decoding process on the read part 600. Similarly, the decoding arithmetic components #1 and #15 respectively read out the parts 601 and 602, and execute the decoding process on the read parts.

Moreover, as illustrated in FIG. 10, the decoding arithmetic unit 211 stores a coded signal (2), after the decoding process is executed, in the interleave memory 202. Specifically, the decoding arithmetic components concurrently store the coded signal (2), after the decoding process is executed, in the banks. For example, as illustrated by the reference number 610 of FIG. 10, the decoding arithmetic component #0 stores in bank #0 the part of the coded signal (2) on which the component itself executes the decoding process. Similarly, as illustrated by the reference numbers 611 and 612 of FIG. 10, the decoding arithmetic components #1 and #15 respectively store the corresponding parts in bank #1 and bank #15. As a result, as illustrated in FIG. 10, each bank stores the data of 200 words.

Moreover, each decoding arithmetic component executes an interleaving process on the coded signal (2) stored in the interleave memory 202. Then, each decoding arithmetic component executes the decoding process on a coded signal (3) after the interleaving process is executed and again stores a coded signal (4) after the decoding process is executed in the interleave memory 202. In other words, each decoding arithmetic component interchanges the order of the coded signal stored in the interleave memory 202, and then reads out 1/16 of the coded signal (3) of which the order is interchanged and concurrently executes the decoding process. Then, each decoding arithmetic component concurrently stores the part of the coded signal (4) on which the component itself executes the decoding process.

Moreover, each decoding arithmetic component executes a de-interleaving process on the coded signal (4) stored in the interleave memory 202. Then, each decoding arithmetic component executes the decoding process on a coded signal (5) after the de-interleaving process is executed and stores a coded signal (6) after the decoding process is executed in the interleave memory 202 once more. In other words, each decoding arithmetic component reads out 1/16 of the coded signal (5) of which the order is restored and concurrently executes the decoding process. Then, each decoding arithmetic component stores the part of the coded signal (6), on which the component itself executes the decoding process, in the interleave memory 202.

Moreover, each decoding arithmetic component determines whether the interleaving process and the de-interleaving process are repeated by a predetermined number. In this case, when it is determined that the processes are not repeated, each decoding arithmetic component again executes the decoding process, the interleaving process, and the de-interleaving process. On the other hand, when it is determined that the processes are repeated by the predetermined number, each decoding arithmetic component terminates the turbo decoding process. At the time point at which the turbo decoding process is terminated, the coded signal after the turbo decoding process is executed is stored in the interleave memory 202. In addition, each decoding arithmetic component repeats, for example, the interleaving process and the de-interleaving process by eight times. It should be noted that the frequency of repeating the interleaving process and the de-interleaving process is limited to eight times. For example, the frequency may be seven times or less, may be nine times or more, or may be an arbitrary number.

As illustrated in FIG. 3, when accessing the interleave memory 202, the decoding arithmetic unit 211 accesses the interleave memory 202 via the converting unit 212 and the access selecting unit 213. Specifically, when the decoding arithmetic unit 211 accesses the interleave memory 202, a logical address is converted into a physical address by the converting unit 212 and the decoding arithmetic unit 211 accesses a position that is identified by the converted physical address. At that time, the access selecting unit 213 controls access in such a manner that access is not performed on the same memory circuit at the same time.

Returning to the explanation of FIG. 3, the converting unit 212 is connected to the decoding arithmetic unit 211 and the access selecting unit 213. The converting unit 212 is, for example, is an electronic circuit such as ASIC, FPGA, CPU, or MPU.

The converting unit 212 includes a plurality of converters. In an example illustrated in FIG. 3, the converting unit 212 includes a converter #0 to a converter #n-1. Hereinafter, unless it is mentioned particularly, it is explained about the case where the converting unit 212 includes 16 converters. In other words, the converter #0 to the converter #15 are respectively connected to the decoding arithmetic component #0 to the decoding arithmetic component #15, and execute processes for the connected decoding arithmetic components. Hereinafter, it is explained about the case where the converting unit 212 includes 16 converters. However, the present invention is not limited to this. The converting unit 212 may include converters of which the number is arbitrary.

In an example illustrated in FIG. 3, it has been explained about the case where the decoding arithmetic unit 211 and the converting unit 212 are separate components. However, the present invention is not limited to this. For example, the decoding arithmetic unit 211 and the converting unit 212 may be integrated.

Figure 11:
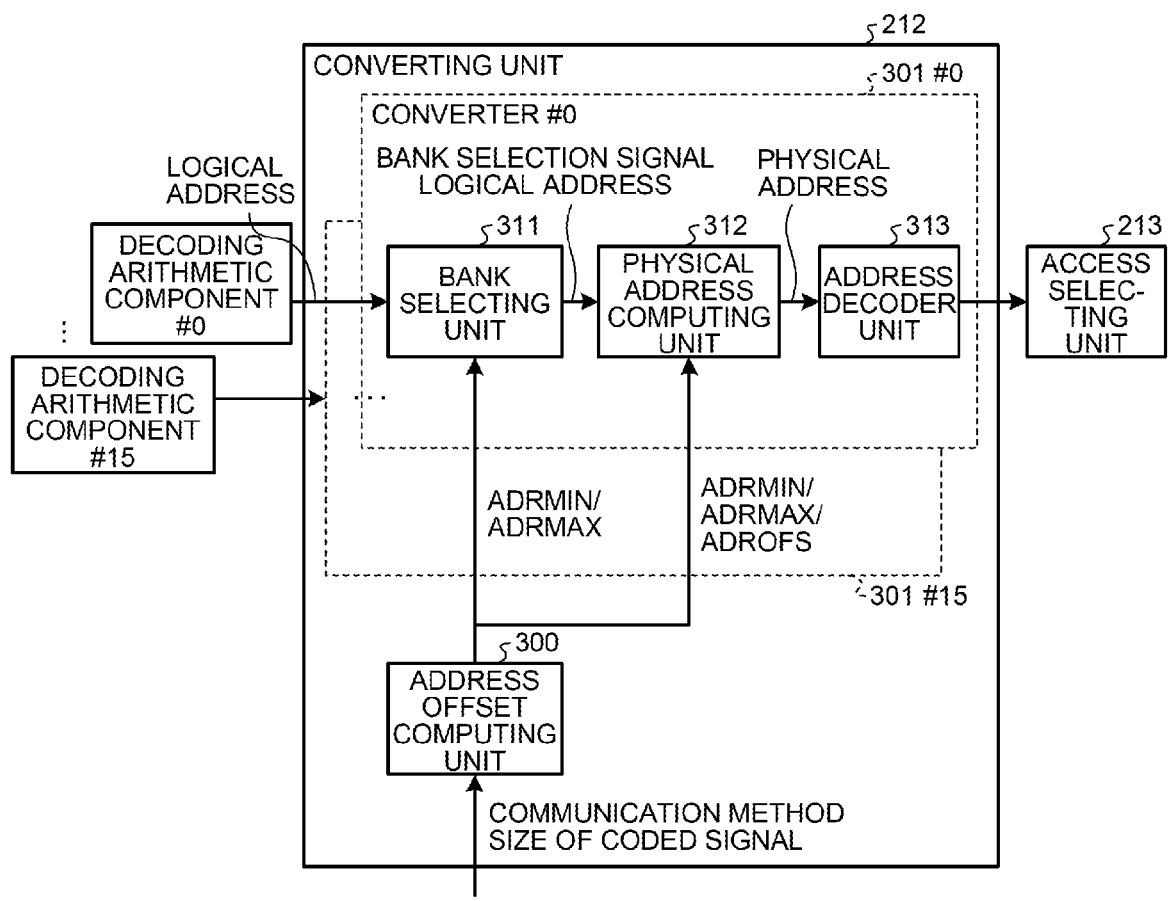
FIG. 11 is a diagram explaining the details of a converting unit according to the second embodiment.

It will be in detail explained about the converting unit 212 with reference to FIG. 11. FIG. 11 is a diagram explaining the details of the converting unit according to the second embodiment. In FIG. 11, components included in the converting unit 212 are illustrated in detail, and the decoding arithmetic component and the access selecting unit 213 are illustrated together for convenience of explanation. In an example illustrated in FIG. 11, the converting unit 212 includes a converter 301 #0 to a converter 301 #15 and an address offset computing unit 300.

The address offset computing unit 300 is connected to a bank selecting unit 311 and a physical address computing unit 312 of each converter. Moreover, as explained below, the address offset computing unit 300 selects by which of the first bank configuration and the second bank configuration it functions. Moreover, the address offset computing unit 300 assigns a coded signal to each bank.

First, it will be explained about a process in which the address offset computing unit 300 selects by which of the first bank configuration and the second bank configuration it functions. The address offset computing unit 300 selects by which of the first bank configuration and the second bank configuration the interleave memory 202 functions in accordance with a communication method of a coded signal.

For example, the address offset computing unit 300 previously stores a bank configuration every communication method. Furthermore, when a communication method is notified by a user or another device that uses the turbo decoding device 200, the address offset computing unit 300 selects a bank configuration corresponding to the notified communication method. For example, the address offset computing unit 300 selects a bank configuration corresponding to HSPA+ when a communication method is HSPA+ and selects a bank configuration corresponding to LTE when a communication method is LTE.

It will be explained about an example of a bank configuration stored in the address offset computing unit 300 with reference to FIGS. 12A and 12B. FIG. 12A is a diagram explaining an example of a bank configuration that is associated with HSPA+. FIG. 12B is a diagram explaining an example of a bank configuration that is associated with LTE. As illustrated in FIGS. 12A and 12B, the address offset computing unit 300 stores an "address offset" that indicates an initial physical address in each bank every communication method. In FIGS. 12A and 12B, an address offset is referred to as "ADROFS". The ADROFS of each bank is a value that is obtained by adding one to the final physical address in the previous bank. For example, when the physical address of bank #0 is "0 to 255", the ADROFS of bank #1 is "256".

For example, as illustrated in FIG. 12A, the address offset computing unit 300 stores ADROFS "0" in association with bank #0 and stores ADROFS "256" in association with bank #1, as an example of a bank configuration associated with HSPA+. Similarly, the address offset computing unit 300 also stores ADROFS in association with bank #2 to bank #19. In other words, in an example illustrated in FIG. 12A, the address offset computing unit 300 stores an initial physical address among physical addresses given to banks when a communication method is "HSPA+". For example, the address offset computing unit 300 stores that the physical address of bank #0 begins with "0" and that the physical address of bank #1 begins with "256".

Moreover, in an example illustrated in FIG. 12B, the address offset computing unit 300 stores ADROFS "0" in association with bank #0 and stores ADROFS "384" in association with bank #1, as an example of a bank configuration associated with LTE. Similarly, the address offset computing unit 300 also stores ADROFS in association with bank #2 to bank #15. In other words, in an example illustrated in FIG. 12B, the address offset computing unit 300 stores an initial physical address among physical addresses given to banks when a communication method is "LTE". For example, the address offset computing unit 300 stores that the physical address of bank #0 begins with "0" and that the physical address of bank #1 begins with "384".

In the example explained with reference to FIGS. 12A and 12B, it has been explained about the case where the address offset computing unit 300 previously stores ADROFS. However, the present invention is not limited to this. For example, the address offset computing unit 300 may compute and set ADROFS for realizing each bank whenever a communication method is notified.

Next, it will be explained about a process in which the address offset computing unit 300 assigns a coded signal to each bank. The address offset computing unit 300 executes a process to be explained below whenever the data size of a coded signal is changed. In other words, whenever the data size of the coded signal stored in the received data memory 201 is changed, the address offset computing unit 300 assigns a coded signal to each bank once more.

The address offset computing unit 300 computes a data size assigned for each bank by using the data size of the coded signal and the number of banks stored in the received data memory 201, and assigns a coded signal to each bank for each computed data size.

For example, it is explained about the case where the data size of a coded signal is "3200 words" and the number of banks is "16". In this case, the address offset computing unit 300 divides the data size "3200" by the number of banks "16" to compute the data size "200" to be assigned to each bank. Then, the address offset computing unit 300 assigns "200-word" data to 16 banks. For example, the address offset computing unit 300 assigns data from a logical address "0" to a logical address "199" to bank #0 and assigns data from a logical address "200" to a logical address "399" to bank #1. Moreover, the address offset computing unit 300 similarly assigns data of logical addresses "400" to "3199" to banks.

Hereinafter, in the coded signal assigned to each bank, a minimum logical address is referred to as "ADRMINI" and a maximum logical address is referred to as "ADRMAX". For example, it is explained about the case where the address offset computing unit 300 assigns the coded signal from the logical address "0" to the logical address "199" to bank #0. In this case, "ADRMINI" of bank #0 is "0" and "ADRMAX" is "199". In other words, the address offset computing unit 300 sets ADRMINI and ADRMAX for each bank to assign a coded signal to each bank.

It is further explained about an example of ADRMINI and ADRMAX that are set for each bank with reference to FIGS. 13A and 13B. FIG. 13A is a diagram explaining an example of ADRMINI and ADRMAX that are set for each bank when HSPA+ is used. FIG. 13B is a diagram explaining an example of ADRMINI and ADRMAX that are set for each bank when LTE is used. In this case, FIG. 13A corresponds to the case where the number of banks is 20 and FIG. 13B corresponds to the case where the number of banks is 16.

As illustrated in FIGS. 13A and 13B, the address offset computing unit 300 sets ADRMINI and ADRMAX for each bank. In an example illustrated in FIG. 13A, the address offset computing unit 300 sets ADRMINI "0" and ADRMAX "159" for bank #0. Moreover, the address offset computing unit 300 similarly sets ADRMINI "160" and ADRMAX "319" for bank #1. In other words, in an example illustrated in FIG. 13A, the address offset computing unit 300 assigns the coded signal of logical addresses "0" to "159" to bank #0 and assigns the coded signal of logical addresses "160" to "319" to bank #1. Moreover, the address offset computing unit 300 similarly assigns the coded signal of logical addresses "320 to 3199" to banks.

In this case, the size of a coded signal that is assigned to each bank is different depending on the size of a coded signal. For example, in an example of FIG. 13B, it has been explained about the case where the data size of a coded signal is "3200". However, when the data size of a coded signal is "1600", the address offset computing unit 300 assigns "100-word" data to each of 16 banks. In other words, the address offset computing unit 300 decides a data size to be assigned to each bank and sets ADRMINI and ADRMAX in such a manner that a coded signal is assigned to all banks. In other words, the address offset computing unit 300 sets ADRMINI and ADRMAX for each bank once more whenever the data size of a coded signal is changed.

Returning to the explanation of FIG. 11, each of the converter 301 #0 to the converter 301 #15 includes the bank selecting unit 311, the physical address computing unit 312, and an address decoder unit 313. Moreover, the converters 301 #0 to #15 concurrently execute processes corresponding to accesses that are performed by the decoding arithmetic components #0 to #15.

The bank selecting unit 311 selects one bank of the interleave memory 202 by using the logical address of the coded signal that is an access target and ADRMINI and ADRMAX that are set for each bank by the address offset computing unit 300. In other words, the bank selecting unit 311 selects a bank in which data identified by the logical address is stored.

Specifically, the bank selecting unit 311 identifies a combination including a logical address among ADRMINI and ADRMAX that are set for each bank by the address offset computing unit 300. In other words, the bank selecting unit 311 identifies a combination of ADRMINI and ADRMAX that satisfies the following Relation (1). Then, the bank selecting unit 311 selects a bank corresponding to the identified combination.

$$\text{ADRMINI } \#n \leq (\text{logical address}) \leq \text{ADRMAX } \#n \quad (1)$$

The #n of Relation (1) corresponds to a number of a bank. For example, in an example illustrated in FIG. 13B, the #n of Relation (1) corresponds to any one of "#0 to #15". In other words, for example, the address offset computing unit 300 determines whether a logical address is included between ADRMINI and ADRMAX for each of banks #0 to #15, and identifies a bank for which the logical address is included.

For example, it is specifically explained by using a logical address "240". Moreover, it is explained by using the example illustrated in FIG. 13B. In this case, the bank selecting unit 311 identifies that a combination of ADRMINI and ADRMAX corresponding to the logical address "240" is a combination of ADRMINI "200" and ADRMAX "399". Then, the bank selecting unit 311 selects bank #1 corresponding to the identified combination.

Figure 14:
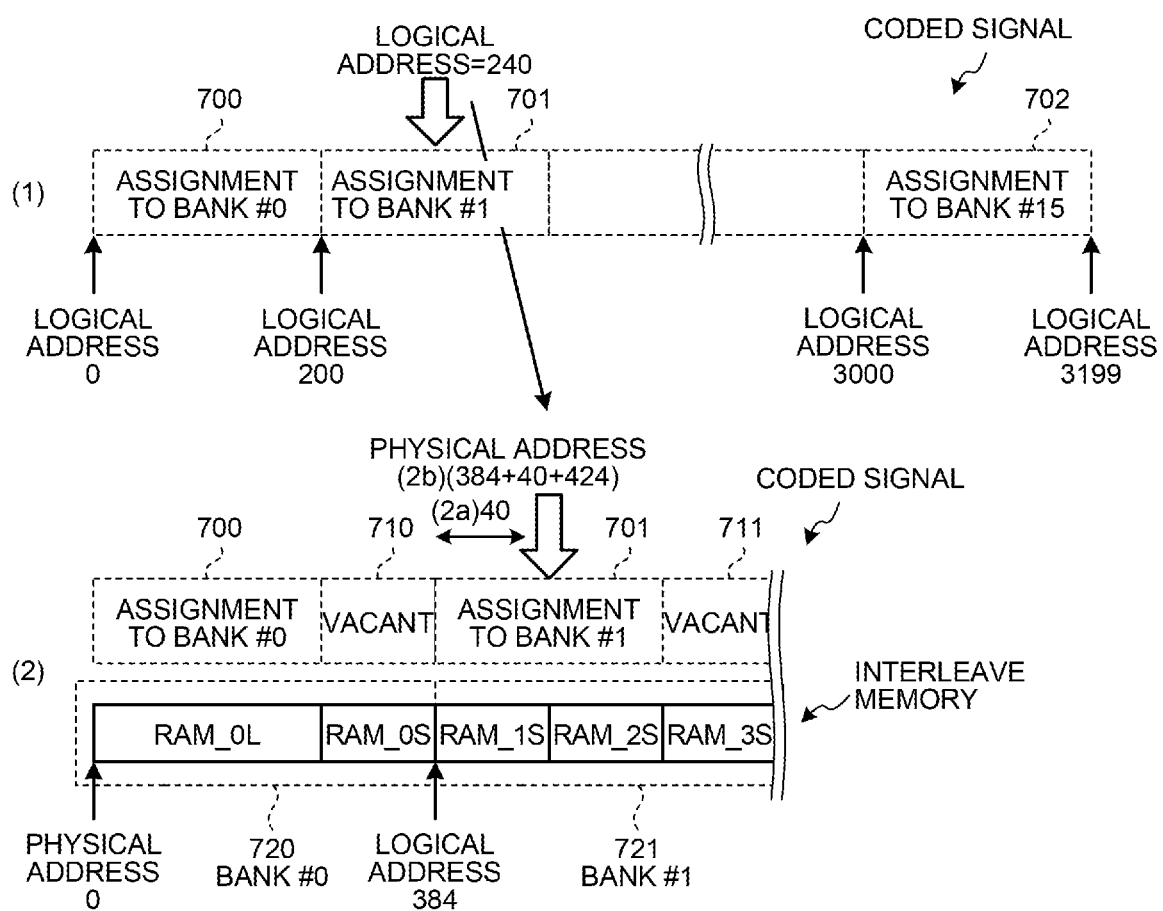
FIG. 14 is a diagram explaining the details of a conversion process that is performed by a physical address computing unit according to the second embodiment.

Returning to the explanation of FIG. 11, the physical address computing unit 312 converts a logical address into a physical address. It will be explained in detail about a conversion process that is performed by the physical address computing unit 312 with reference to FIG. 14. FIG. 14 is a diagram explaining the details of a conversion process that is performed by the physical address computing unit according to the second embodiment. A coded signal is illustrated in (1) of FIG. 14. Moreover, in (2) of FIG. 14, a part assigned to bank #0 and a part assigned to bank #1 in the coded signal are illustrated and banks #0 and #1 of the interleave memory 202 are illustrated.

Moreover, the reference numbers 700 to 702 of FIG. 14 indicate the parts of the coded signal that are assigned to the banks. For example, the reference number 700 of FIG. 14 is the part of the coded signal that corresponds to logical addresses "0 to 199" and is assigned to bank #0. Moreover, the reference numbers 710 and 711 of FIG. 14 indicate vacant parts when the reference numbers 700 to 702 of FIG. 14 are stored in the banks. For example, the reference number 710 of FIG. 14 indicates a vacant part in bank #0 when the reference number 700 of FIG. 14 is stored in the bank #0. Moreover, the reference numbers 720 and 721 of FIG. 14 respectively indicate the banks #0 and #1 of the interleave memory 202.

As illustrated in (1) of FIG. 14, it is explained about the case where the logical address "240" is converted into a physical address. In this case, as described above, the bank selecting unit 311 selects bank #1 for the logical address "240". After that, the physical address computing unit 312 computes what number logical address from ADRMINI set for bank #1 is the logical address "240". For example, when ADRMINI of bank #1 is "200" as illustrated in (1) of FIG. 14, the physical address computing unit 312 computes "40" as illustrated in (2a) of FIG. 14. In other words, this indicates that the data of the logical address "240" is stored at the "40th" position of bank #1. The physical address computing unit 312 then computes a physical address that is located at the "40th" position from ADROFS of bank #1. For example, when ADROFS of bank #1 is "384", the physical address computing unit 312 computes a physical address "384+40=424", as illustrated in (2b) of FIG. 14. In other words, the physical address computing unit 312 converts the logical address "240" into the physical address "424".

A physical address computation process performed by the physical address computing unit 312 is like the following Expression (2).

(Physical address)=(Logical address)−ADRMINI #n+ADROFS #n    (2)

In Expression (2), #n corresponds to a number that indicates a bank selected by the bank selecting unit 311. For example, when bank #1 is selected by the bank selecting unit 311, the value of ADRMINI #1 and the value of ADROFS #1 are assigned. More specifically, when ADRMINI #1 is "200" and ADROFS #1 is "384", the following Expression (2) becomes Expression (3).

(Physical address)=(Logical address)−200+384    (3)

Returning to the explanation of FIG. 11, the address decoder unit 313 creates a RAM selection signal that is information indicating which of the memory circuits is it and a memory position signal indicating a position in the memory circuit, from the physical address that is converted by the physical address computing unit 312. In general, the high-order side of physical addresses indicates which of the memory circuits is it and the low-order side of the physical addresses indicates a position in the memory circuit. Considering this fact, the address decoder unit 313 uses, among physical addresses, a high-order part indicating which of the memory circuits is it as a RAM selection signal and uses a low-order part indicating a position in the memory circuit as a memory position signal. For example, when the number of bits of a physical address is "12", the RAM selection signal corresponds to the high-order four or five bits and the memory position signal corresponds to the low-order eight bits.

The access selecting unit 213 is connected to the converting unit 212 and the interleave memory 202. The access selecting unit 213 is, for example, an electronic circuit such as ASIC, FPGA, CPU, or MPU. The access selecting unit 213 receives a RAM selection signal and a memory position signal from each converter, and controls an access to the interleave memory 202 in such a manner that an access is not performed on the same memory circuit at the same time. Specifically, when receiving the same RAM selection signal from the plurality of converters, the access selecting unit 213 controls sequential accesses without simultaneously accessing to the plurality of memory circuits.

Moreover, the access selecting unit 213 performs access selection not in the unit of bank but in the unit of memory circuit. This is based on the fact that a combination of memory circuits for realizing a bank is different depending on communication methods in the second embodiment. In other words, the access selecting unit 213 performs access selection not in the unit of bank but in the unit of memory circuit, and thus can use the common access selecting unit 213 without providing the access selecting unit 213 every communication method or every combination of memory circuits for realizing a bank.

In the second embodiment, actually, the plurality of converters does not designate the same RAM selection signal simultaneously. Specifically, the decoding arithmetic components #0 to #15 respectively access different banks in the case of reading and writing. Moreover, the banks are realized by using separate memory circuits. For this reason, the plurality of converters does not designate the same RAM selection signal simultaneously.

In this way, as described above, the converting unit 212 selects by which of the first bank configuration and the second bank configuration the interleave memory 202 functions in accordance with a communication method of a coded signal. Then, the converting unit 212 controls an access to the interleave memory 202 in accordance with the selected bank configuration.

Specifically, the converting unit 212 assigns a logical address to each bank for each divided coded signal after dividing a coded signal by the number of banks. Then, when receiving a logical address, the converting unit 212 identifies a bank corresponding to data identified by the received logical address, converts the logical address into a physical address for the identified bank, and accesses a position that is identified by the physical address.

Returning to the explanation of FIG. 3, when the turbo decoding process performed by the decoding arithmetic unit 211 is terminated, the output control unit 214 reads out data stored in the interleave memory 202 and outputs the read data. In this case, the output destination of data by the output control unit 214 corresponds to, for example, another device that uses the turbo decoding device 200 or a processing unit that belongs to a high-order layer of the turbo decoding device 200.

Process by Turbo Decoding Device

Figure 15:
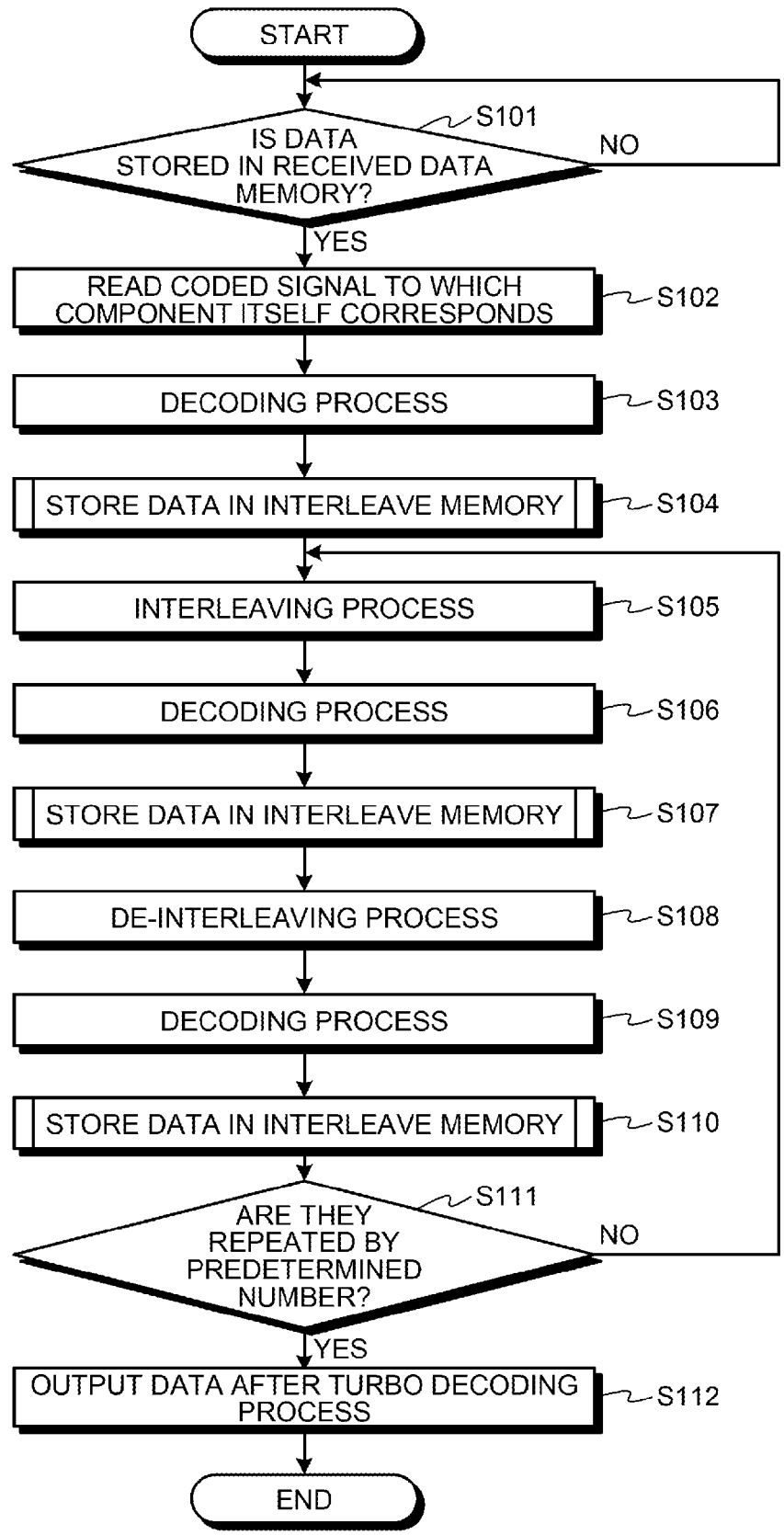
FIG. 15 is a flowchart explaining a flow example of a process that is performed by the turbo decoding device according to the second embodiment.

Next, it will be explained about a flow example of a process that is performed by the turbo decoding device 200 according to the second embodiment with reference to FIG. 15. FIG. 15 is a flowchart explaining a flow example of a process that is performed by the turbo decoding device according to the second embodiment.

As illustrated in FIG. 15, when a coded signal is stored in the received data memory 201 (Step S101: YES), each decoding arithmetic component in the decoding arithmetic unit 211 reads out a part of a coded signal (1) to which the component itself corresponds (Step S102). Then, each decoding arithmetic component executes a decoding process on the read part (Step S103). Then, each decoding arithmetic component concurrently stores a coded signal (2), after the decoding process is executed, in the corresponding bank of the interleave memory 202 (Step S104). In this case, when each decoding arithmetic component stores data in the interleave memory 202 and reads data, the converting unit 212 converts a logical address into a physical address. As a result, each decoding arithmetic component writes or reads data to or from a position that is identified by the physical address.

Then, each decoding arithmetic component executes an interleaving process on the coded signal (2) stored in the interleave memory 202 (Step S105), and executes the decoding process on a coded signal (3) after the interleaving process (Step S106). In other words, each decoding arithmetic component interchanges the order of the coded signal (2) stored in the interleave memory 202, and then reads out 1/16 of the coded signal (3) of which the order is interchanged and concurrently executes the decoding process. Then, each decoding arithmetic component again stores a coded signal (4), after the decoding process is executed, in parallel in the corresponding bank of the interleave memory 202 (Step S107).

Then, each decoding arithmetic component executes a de-interleaving process on the coded signal (4) stored in the interleave memory 202 (Step S108), and executes the decoding process on a coded signal (5) after the de-interleaving process is executed (Step S109). In other words, each decoding arithmetic component restores the order of the coded signal (4) stored in the interleave memory 202, and then reads out 1/16 of the coded signal (5) of which the order is restored and concurrently executes the decoding process. Then, each decoding arithmetic component once more stores a coded signal (6), after the decoding process is executed, in parallel in the corresponding bank of the interleave memory 202 (Step S110).

In this case, each decoding arithmetic component determines whether the interleaving process and the de-interleaving process are repeated by a predetermined number (Step S111). In other words, each decoding arithmetic component determines whether a series of processes of the Steps S104 to S109 is executed by the predetermined number. When it is determined that the processes are not repeated (Step S111: NO), each decoding arithmetic component returns to Step S105 and again executes a series of processes of Steps S104 to S109. On the other hand, when it is determined that the processes are executed (Step S111: YES), each decoding arithmetic component terminates the turbo decoding process, and then the output control unit 214 outputs data after the turbo decoding process (Step S112).

The processing procedures are not limited to the order. The processing procedures may be appropriately changed within the scope in which processing matters are not contradicted. For example, the coded signal may be stored in the interleave memory 202 as it is without executing the decoding process at Step S103.

Process of Converting Unit

Next, it will be explained about a flow example of a process that is performed by the converting unit 212 according to the second embodiment with reference to FIG. 16. In other words, when each decoding arithmetic component writes data in the interleave memory 202 or reads data, it will be explained about a flow of a process in which the converting unit 212 converts a logical address into a physical address. FIG. 16 is a flowchart explaining a flow example of a process that is performed by the converting unit according to the second embodiment. A process explained by using FIG. 16 corresponds to, for example, Steps S104, S107, and S110 in FIG. 15.

As illustrated in FIG. 16, when it is a timing for accessing the interleave memory 202 (Step S201: YES), the bank selecting unit 311 in the converting unit 212 selects a bank in which data identified by the logical address is stored (Step S202). In other words, for example, the bank selecting unit 311 identifies a combination including the logical address among ADRMINI and ADRMAX that are set for each bank by the address offset computing unit 300. Then, the bank selecting unit 311 selects a bank corresponding to the identified combination. For example, in the case of the explanation using the example illustrated in FIG. 13B, the bank selecting unit 311 selects bank #1 when the logical address is "240".

Then, the physical address computing unit 312 computes a physical address (Step S203). In other words, for example, the physical address computing unit 312 computes what number logical address from ADRMINI set for bank #1 is the logical address "240". For example, in an example illustrated in (1) of FIG. 14, the physical address computing unit 312 computes "40". The physical address computing unit 312 then computes a physical address that is located at the "40th" position from ADROFS of bank #1. In an example illustrated in (2b) of FIG. 14, the physical address computing unit 312 computes a physical address "384+40=424". After that, data is stored or read with respect to the physical address computed by the physical address computing unit 312.

Coded Signal Assignment Process

Next, it will be explained about a flow example of a coded signal assignment process according to the second embodiment with reference to FIG. 17. FIG. 17 is a flowchart explaining a flow example of a coded signal assignment process according to the second embodiment. A process that is explained by using FIG. 17 is, for example, executed prior to a series of processes illustrated in FIG. 16.

As illustrated in FIG. 17, when the size of a coded signal is changed (Step S301: YES), the address offset computing unit 300 computes a data size that is assigned to each bank (Step S302). In other words, for example, it is explained about the case where the data size of a coded signal is "3200 words" and the number of banks is "16". In this case, the address offset computing unit 300 divides the data size "3200" by the number of banks "16" to compute a data size "200" to be assigned to each bank.

Then, the address offset computing unit 300 assigns the coded signal to each bank for each computed data size (Step S303). In other words, for example, the address offset computing unit 300 assigns "200-word" data to each of 16 banks. More specifically, the address offset computing unit 300 assigns data of logical addresses "0" to "199" to bank #0 and similarly assigns data of logical addresses "200" to "3199" to the banks. In other words, the address offset computing unit 300 computes a data size to be assigned to each bank and sets ADRMINI and ADRMAX in each bank, in such a manner that the coded signal is assigned to all banks.

It should be noted that the processing procedures are not limited to the case where the processing procedures are executed prior to a series of processes illustrated in FIG. 16. The processing procedures may be executed in parallel with a series of processes illustrated in FIG. 16. In this case, a series of processes illustrated in FIG. 17 is executed until Step S202 in the process illustrated in FIG. 16 is executed.

Bank Configuration Selection Process

Figure 18:
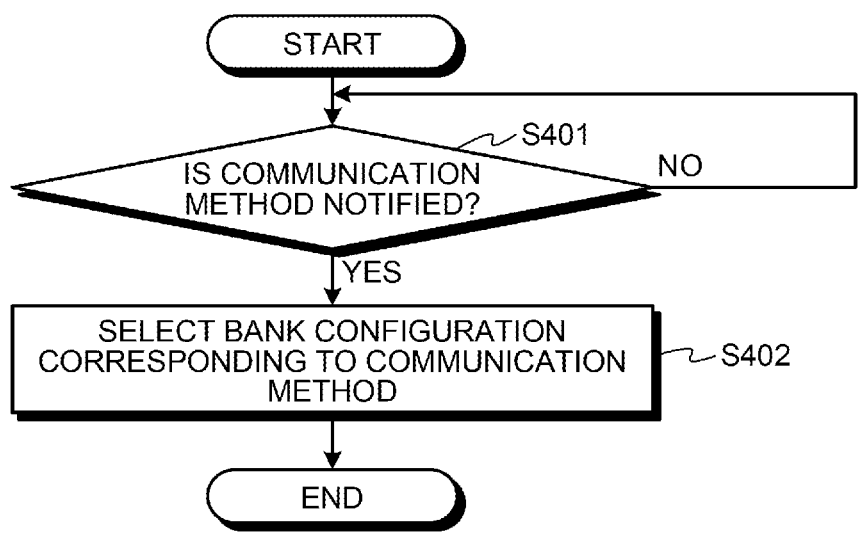
FIG. 18 is a diagram explaining a flow example of a bank configuration selection process according to the second embodiment.

Next, it will be explained about a flow example of a bank configuration selection process according to the second embodiment with reference to FIG. 18. FIG. 18 is a diagram explaining a flow example of a bank configuration selection process according to the second embodiment. A process that is explained by using FIG. 18 is, for example, is executed prior to a series of processes illustrated in FIGS. 16 and 17.

As illustrated in FIG. 18, when a communication method is notified (Step S401: YES), the address offset computing unit 300 selects a bank configuration corresponding to the communication method (Step S402). For example, the address offset computing unit 300 stores a bank configuration for each communication method and selects a bank configuration corresponding to the informed communication method. For example, the address offset computing unit 300 selects a bank configuration corresponding to HSPA+ when a communication method is HSPA+ and selects a bank configuration corresponding to LTE when a communication method is LTE.

It should be noted that the processing procedures are not limited to the case where the processing procedures are executed prior to a series of processes illustrated in FIGS. 16 and 17. The processing procedures may be executed in parallel with a series of processes illustrated in FIGS. 16 and 17. In this case, a series of processes illustrated in FIG. 18 is executed until Step S202 in the process illustrated in FIG. 16 and Step S302 illustrated in FIG. 17 are executed.

Effect of Second Embodiment

As described above, according to the second embodiment, the turbo decoding device 200 includes the interleave memory 202, and accesses the interleave memory 202 to read and write data. Moreover, the interleave memory 202 includes the plurality of memory circuits, and is formed as one memory space by coupling the plurality of memory circuits. Moreover, the interleave memory 202 functions as the first bank configuration by which the first capacity is assigned to each bank or the second bank configuration by which the second capacity is assigned to each bank, in accordance with a combination of the memory circuits. Moreover, the turbo decoding device 200 selects by which of the first bank configuration and the second bank configuration the interleave memory 202 functions in accordance with a communication method of a coded signal, and accesses the interleave memory 202 in accordance with the selected bank configuration. As a result, according to the second embodiment, the turbo decoding device 200 corresponding to the plurality of communication methods can suppress the burden of memory because a memory for each communication method is not prepared. In other words, according to the second embodiment, because a separate memory is not mounted depending on a communication method such as LTE or HSPA+ or a processing method of the turbo decoding process such as QPP or PIL, the turbo decoding device can suppress the burden of memory.

In particular, a part executing a turbo decoding process occupies around 80% in a baseband processing unit. According to the second embodiment, because a turbo-decoding processing unit that occupies the most of the baseband processing unit can be shared in different communication methods and the turbo decoding device can be downsized, components can be shared and low cost can be realized.

Moreover, the turbo decoding device 200 converts a logical address into a physical address and accesses a position that is identified by the physical address. As a result, even if a bank configuration is changed in accordance with the change of a communication method, the same converting unit 212 can be shared without mounting the separate converting unit 212 for each bank configuration by specifying an access destination by using the same process.

In the second embodiment, after considering the capacity of each bank, a series of physical addresses that is used irrespective of the bank configuration is given to the memory circuits. As a result, because a process that is executed by a converter is not changed even if the bank configuration is changed, the same converter can be used regardless of a bank configuration.

Moreover, the turbo decoding device 200 assigns a logical address to each bank for each divided coded signal that is obtained by dividing a coded signal by the number of banks. Then, the turbo decoding device 200 identifies a bank corresponding to data that is identified by the logical address of a coded signal to be accessed, and converts the logical address into a physical address for the identified bank. The turbo decoding device 200 then accesses a position that is identified by the physical address. As a result, because data are not unevenly distributed in any bank and data can be dispersedly arranged in banks, the turbo decoding device can access plural banks in parallel in the case of a decoding process. Therefore, the turbo decoding device can concurrently execute the decoding process and can quickly execute the decoding process.

[c] Third Embodiment

It has been explained about the embodiments of the present invention till now. The present invention may be also realized by another embodiment in addition to the embodiments described above. Therefore, it will be below explained about the other embodiment.

System Configuration

Moreover, among the processes described in the present embodiments, the whole or a part of processes that have been automatically performed can be manually performed. Alternatively, the whole or a part of processes that have been manually performed can be automatically performed in a well-known method. For example, a user may manually perform the notification of a communication method, or the turbo decoding device may identify a communication method by analyzing the communication method from the received coded signal. Also, processing procedures, control procedures, concrete titles, and information including various types of data and parameters (FIGS. 1 to 18), which are described in the document and the drawings, can be arbitrarily changed except that they are specially mentioned.

Each component of each device illustrated in the drawings is a functional concept. Therefore, these components are not necessarily constituted physically as illustrated in the drawings. In other words, the specific configuration of dispersion/integration of each device is not limited to the illustrated configuration. Therefore, all or a part of each device can dispersed or integrated functionally or physically in an optional unit in accordance with various types of loads or operating conditions. For example, in the case of the explanation using the example illustrated in FIG. 3, the received data memory 201 may be configured as the external device of the turbo decoding device 200 to be connected via a network.

As described above, according to an aspect of the present invention, the burden of memory can be suppressed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A turbo decoding device comprising:
a memory unit that stores data in an interleaving process performed in a process of decoding a coded signal encoded with a turbo code; and
an access unit that accesses the memory unit to read and write the data, wherein
the memory unit includes a plurality of memory circuits, is formed as one memory space by coupling the plurality of memory circuits, and functions as a first bank configuration by which a first capacity is assigned to each bank or a second bank configuration by which a second capacity is assigned to each bank in accordance with a combination of the memory circuits, and
the access unit selects by which of the first bank configuration and the second bank configuration the memory unit functions in accordance with a communication method of the coded signal and accesses the memory unit in accordance with the selected bank configuration.

2. The turbo decoding device according to claim 1, wherein the access unit converts first identification information for uniquely identifying data that forms the coded signal into second identification information for uniquely identifying a position in the memory space, and the access unit accesses a position that is identified by the second identification information.

3. The turbo decoding device according to claim 2, wherein the access unit assigns the first identification information to each bank for each divided coded signal that is obtained by dividing the coded signal by a number of banks, identifies, when receiving the first identification information, a bank corresponding to data that is identified by the received first identification information, converts the first identification information into the second identification information for the identified bank, and accesses the position that is identified by the second identification information.

4. A turbo decoding device comprising:
a memory unit that stores data in an interleaving process performed in a process of decoding a coded signal encoded with a turbo code; and
an access unit that accesses the memory unit to read and write the data, wherein
the memory unit includes a plurality of memory circuits, is formed as one memory space by coupling the plurality of memory circuits, and functions as a Prunable Prime Interleaver (PIL) bank configuration by which a capacity used when executing an interleaving process by using PIL is assigned to each bank or a Quadratic Permutation Polynomial Interleaver (QPP) bank configuration by which a capacity used when executing the interleaving process by using QPP is assigned to each bank in accordance with a combination of the memory circuits, and
the access unit selects by which of the PIL bank configuration and the QPP bank configuration the memory unit functions in accordance with a communication method of the coded signal and accesses the memory unit in accordance with the selected bank configuration.

5. A communication device comprising:
a memory unit that stores data in an interleaving process performed in a process of decoding a coded signal encoded with a turbo code; and
an access unit that accesses the memory unit to read and write the data, wherein
the memory unit includes a plurality of memory circuits, is formed as one memory space by coupling the plurality of memory circuits, and functions as a first bank configuration by which a first capacity is assigned to each bank or a second bank configuration by which a second capacity is assigned to each bank in accordance with a combination of the memory circuits, and
the access unit selects by which of the first bank configuration and the second bank configuration the memory unit functions in accordance with a communication method of the coded signal and accesses the memory unit in accordance with the selected bank configuration.

* * * * *